(12) United States Patent
Song et al.

(10) Patent No.: US 9,953,867 B2
(45) Date of Patent: Apr. 24, 2018

(54) METHOD FOR FORMING SEED LAYER ON HIGH-ASPECT RATIO VIA AND SEMICONDUCTOR DEVICE HAVING HIGH-ASPECT RATIO VIA FORMED THEREBY

(71) Applicant: KOREA INSTITUTE OF INDUSTRIAL TECHNOLOGY, Chungcheongnam-do (KR)

(72) Inventors: Young Sik Song, Gyeonggi-do (KR); Tae Hong Yim, Gyeonggi-do (KR)

(73) Assignee: KOREA INSTITUTE OF INDUSTRIAL TECHNOLOGY (KR)

( * ) Notice: Subject to any disclaimer, the term of this patent is extended or adjusted under 35 U.S.C. 154(b) by 0 days.

(21) Appl. No.: 14/781,115

(22) PCT Filed: Mar. 24, 2014

(86) PCT No.: PCT/KR2014/002437
§ 371 (c)(1),
(2) Date: Sep. 29, 2015

(87) PCT Pub. No.: WO2014/157883
PCT Pub. Date: Oct. 2, 2014

(65) Prior Publication Data
US 2016/0035620 A1 Feb. 4, 2016

(30) Foreign Application Priority Data
Mar. 29, 2013 (KR) .................. 10-2013-0034764

(51) Int. Cl.
*H01L 21/768* (2006.01)
*H01L 21/285* (2006.01)
(Continued)

(52) U.S. Cl.
CPC .... *H01L 21/76843* (2013.01); *H01L 21/2855* (2013.01); *H01L 21/76873* (2013.01);
(Continued)

(58) Field of Classification Search
CPC ......... H01L 21/76843; H01L 21/75874; H01L 21/76871–21/76879; H01L 2221/1084–2221/1089; H01L 23/5226
See application file for complete search history.

(56) References Cited

U.S. PATENT DOCUMENTS 6,046,097 A * 4/2000 Hsieh ................ H01L 21/76843
257/E21.584
6,362,099 B1 3/2002 Gandikota
(Continued)

FOREIGN PATENT DOCUMENTS

EP 1101834 5/2001
KR 1020010032498 4/2001
(Continued)

OTHER PUBLICATIONS

German Examination Report for German Application No. 11 2014 001 729.9, dated Apr. 26, 2016, 6 pages.
(Continued)

*Primary Examiner* — Jose R Diaz
(74) *Attorney, Agent, or Firm* — RatnerPrestia

(57) ABSTRACT

Disclosed are a method of forming a seed layer on a high-aspect ratio via and a semiconductor device having a high-aspect ratio via formed thereby. Thus, efficient Cu filling-plating is possible, and plating adhesion of the seed layer to filling-plated Cu can be simply and profitably enhanced, thus imparting high durability upon forming metal wiring for electronic components. Moreover, stress of the seed layer can be lowered, thereby enhancing plating adhesion.

13 Claims, 15 Drawing Sheets

(51) Int. Cl.
  *H01L 23/522*  (2006.01)
  *H01L 23/532*  (2006.01)

(52) U.S. Cl.
  CPC .. *H01L 21/76874* (2013.01); *H01L 21/76898* (2013.01); *H01L 23/5226* (2013.01); *H01L 23/53238* (2013.01); *H01L 2924/0002* (2013.01)

(56) References Cited

U.S. PATENT DOCUMENTS

| | | |
|---|---|---|
| 6,458,251 B1 | 10/2002 | Sundarrajan |
| 6,458,255 B2 | 10/2002 | Chiang |
| 6,627,542 B1 * | 9/2003 | Gandikota ........ H01L 21/76843 257/E21.585 |
| 6,758,947 B2 * | 7/2004 | Chiang ................. C23C 14/046 204/192.12 |
| 6,770,559 B1 | 8/2004 | Adem |
| 2006/0183346 A1 | 8/2006 | Liu |

FOREIGN PATENT DOCUMENTS

| | | |
|---|---|---|
| KR | 1020010051740 | 6/2001 |
| KR | 100447323 | 9/2004 |
| KR | 100717086 | 5/2007 |
| WO | 2011149965 | 12/2011 |

OTHER PUBLICATIONS

International Search Report for International Application No. PCT/KR2014/002437 dated Jun. 2, 2014.

\* cited by examiner (a)

(b)

METHOD FOR FORMING SEED LAYER ON HIGH-ASPECT RATIO VIA AND SEMICONDUCTOR DEVICE HAVING HIGH-ASPECT RATIO VIA FORMED THEREBY

CROSS-REFERENCE TO RELATED APPLICATIONS

This application is a U.S. National Phase patent application of International Patent Application No. PCT/KR2014/002437, filed Mar. 24, 2014, which claims priority to Korean Patent Application No. 10-2013-0034764, filed Mar. 29, 2013, each of which is incorporated by reference herein in its entirety.

TECHNICAL FIELD

The present invention relates to a method of forming a seed layer on a high-aspect ratio via and a semiconductor device having a high-aspect ratio via formed thereby.

BACKGROUND ART

With the demand for high speeds and high degrees of integration of electronic components such as semiconductor devices, metal wiring in semiconductor devices has become fine and is provided in the form of a multilayered structure. When the width of the metal wiring is smaller in this way, signals are delayed due to capacitance and resistance of the metal wiring. Thus, in order to reduce the signal delay, Cu is utilized as a low-resistance metal.

Cu typically used for metal wiring is formed through electroplating or electroless plating in grooves or holes of a substrate. To enhance plating adhesion between the substrate and Cu, a seed layer may be previously formed on the grooves or holes (hereinafter referred to as "vias") of the substrate.

However, as electronic components such as 3D Si packages are made more precisely, the aspect ratio (ratio of average depth and average width) of the vias of a substrate is increased to at least 10:1, and thus a seed layer has to be formed to a relatively uniform and appropriate thickness on the bottom or the inner wall of the vias so that Cu for filling-plating is more easily and rigidly deposited. For high-aspect ratio vias of a substrate such as Si, which is not electrically conductive and thus makes performing a plating process difficult, the formation of a seed layer to a thickness sufficient to enable efficient filling-plating is regarded as very important, and also the area of via openings has to be sufficiently ensured.

DISCLOSURE

Technical Problem

Accordingly, an object of the present invention is to provide a method of forming a seed layer, wherein the seed layer is formed to a uniform and sufficient thickness on both the inner wall and the bottom of high-aspect ratio vias so as to enhance plating adhesion to filling-plated Cu, and the area of via openings may also be sufficiently ensured; and a semiconductor device having high-aspect ratio vias with high durability formed by the method.

Another object of the present invention is to provide a method of forming a seed layer, wherein stress of the seed layer may be effectively reduced; and a semiconductor device having high-aspect ratio vias with enhanced plating adhesion formed by the method.

The objects of the present invention are not limited to the foregoing, and the other objects not mentioned herein will be able to be clearly understood to those skilled in the art from the following description.

Technical Solution

In order to accomplish the above objects, the present invention provides a method of forming a seed layer on a high-aspect ratio via, comprising: preparing a substrate having a via; and forming a seed layer on the substrate, wherein the via is configured such that an average depth is at least 10 times an average width based on a cross-section thereof, and forming the seed layer is performed by at least one of a tilting movement for tilting the substrate front and back and left and right and a turning movement of the substrate so that a seed layer forming material is deposited at a predetermined angle or less, and a change in a direction of the substrate is intermittent or continuous.

In a preferred embodiment, the predetermined angle is 2.86° or less as an angle (θ) represented by Equation 1 below:

$$\theta = a\cos[D/((D^2+(\tfrac{1}{2}W)^2)^{1/2})] \quad \text{Equation 1}$$

(wherein D is a depth of the via, and W is a width of the via.)

In a preferred embodiment, forming the seed layer comprises a first step of controlling a pressure to 7~13 mtorr and a second step of controlling a pressure to 2.5~5 mtorr.

In a preferred embodiment, forming the seed layer further comprises a third step of controlling a pressure to 0.5~2 mtorr, after the second step.

In a preferred embodiment, forming the seed layer is performed by applying a target power of 2~5 kW.

In a preferred embodiment, forming the seed layer is performed by applying a bias to the substrate.

In a preferred embodiment, the seed layer is a Mo or Cu seed layer.

In a preferred embodiment, the method further comprises additionally forming a Cu seed layer on the Mo seed layer or a Mo seed layer on the Cu seed layer, after forming the Mo or Cu seed layer.

In a preferred embodiment, the method further comprises forming an additional seed layer so that a Mo seed layer and a Cu seed layer are alternately stacked, after additionally forming the seed layer.

In a preferred embodiment, the seed layer has a thickness of 20 nm~1 μm.

In a preferred embodiment, the via is configured such that a cross-sectional area of a via opening after forming the seed layer is 50% or more compared to before forming the seed layer, when viewed from above.

In a preferred embodiment, when the seed layer is a Mo or Cu seed layer, filling-plating the substrate with Cu is further performed after depositing the seed layer.

In addition, the present invention provides a semiconductor device having a high-aspect ratio via, comprising: a substrate having a via with an aspect ratio ranging from 1:10 to 1:60; and a seed layer formed on the substrate, wherein the via is configured such that a cross-sectional area of a via opening after formation of the seed layer is 50% or more compared to before formation of the seed layer, when viewed from above.

In a preferred embodiment, when the seed layer is formed of at least one material selected from among Cu and Mo, a Cu filling layer that is charged in the via by filling-plating is further provided on the seed layer.

In a preferred embodiment, the seed layer has a thickness of 20 nm~1 μm.

In a preferred embodiment, the seed layer is provided in a multilayered structure in which a Mo seed layer and a Cu seed layer are alternately stacked.

Advantageous Effects

According to the present invention, efficient Cu filling-plating is possible, and plating adhesion of a seed layer to filling-plated Cu can be simply and profitably enhanced, thus imparting superior durability upon forming metal wiring for electronic components.

Also, stress of the seed layer can be reduced, thereby enhancing plating adhesion.

MODE FOR INVENTION

Figure 1:
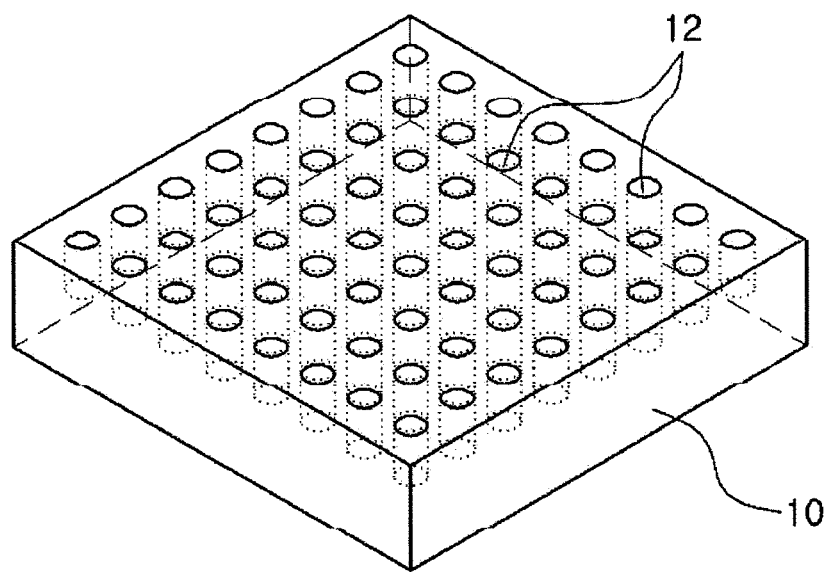
FIG. 1 illustrates a substrate having vias.
Figure 1:
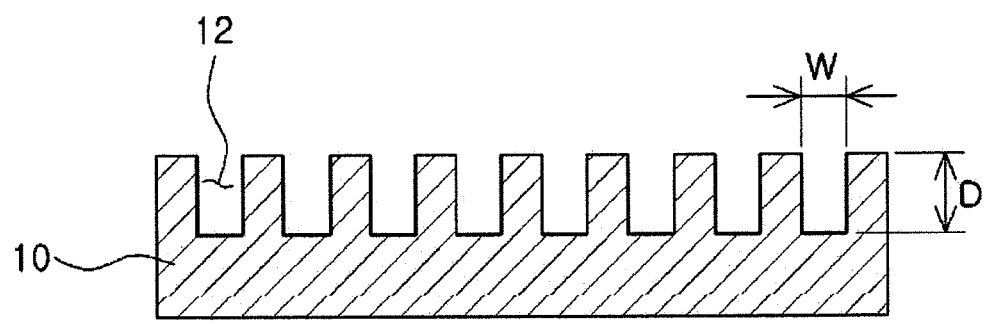

FIGS. 1(a) and 1(b) are a perspective view and a front view respectively illustrating a substrate having vias. As illustrated in FIG. 1, a substrate 10 includes vias 12 for forming metal wiring. The vias may be formed through the substrate, as in the shape of a hole, or may be configured such that one side of the substrate is opened and the other side thereof is closed, as in the shape of a groove.

The substrate having vias thus formed is filling-plated with Cu to form metal wiring so as to be adapted for use in electronic components. In order for the substrate having the metal wiring to serve in an electronic component, good adhesion has to be ensured between the substrate and Cu. To this end, a seed layer may be deposited on the vias. Such a seed layer may function as an electrode or wiring that allows electricity to flow so that a substrate, which is not electrically conductive, may efficiently undergo filling-plating.

However, as electronic components become much finer, the aspect ratio (ratio of average depth and average width) of vias of the substrate is considerably increased to the level of at least 10:1, and thus the opening of vias becomes narrow, thereby making it difficult to deposit the seed layer inside the vias or to penetrate Cu into the vias upon filling-plating. Specifically, as the aspect ratio is higher, the width of vias is decreased, and thus the seed layer is not efficiently deposited on the bottom or the inner wall of the vias. In particular, the seed layer is preferentially deposited on the upper portion of the inner wall of the vias and thus may be formed thick, but carrying out deposition of the seed layer becomes increasingly difficult on the lower portion of the vias toward the bottom.

To solve such problems, the present invention provides a method of forming a seed layer on high-aspect ratio vias, comprising: preparing a substrate having vias; and forming a seed layer on the substrate, wherein the vias are configured such that the average depth is at least 10 times the average width based on a cross-section thereof, and forming the seed layer is performed by tilting the substrate front and back and left and right so that a seed layer forming material is deposited at a predetermined angle or less.

As such, the predetermined angle may be an angle ($\theta$) represented by the following Equation 1, and may be 2.86° or less.

$$\theta = \arccos [D/((D^2+(\tfrac{1}{2}W)^2)^{1/2})] \qquad \text{Equation 1}$$

(wherein D is a depth of a via, and W is a width of a via.)

So long as the substrate used in the present invention has vias having a ratio of average depth and average width (an aspect ratio) of at least 10:1, the kind thereof is not particularly limited. Examples thereof may include glass, plastic, and ceramics. Preferably useful is Si. The vias of the substrate according to the present invention preferably have a higher aspect ratio, and the upper limit of the aspect ratio of the vias is not particularly limited, but the aspect ratio is difficult to exceed 60 times due to the processing limitation.

In order to form the seed layer on the substrate, various processes such as evaporation, sputtering, CVD (chemical vapor deposition), and ALD (atomic layer deposition), may be applied, and thus the type of process of forming a seed layer is not particularly limited.

When the seed layer is formed on the substrate having high-aspect ratio vias as mentioned above, the substrate is tilted in a predetermined angle range so that a seed layer forming material is deposited. More specifically, the substrate is preferably tilted front and back and left and right so that deposition is carried out under the condition that the angle ($\theta$) represented by Equation 1 is 2.86° or less, resulting in a seed layer.

Figure 2:
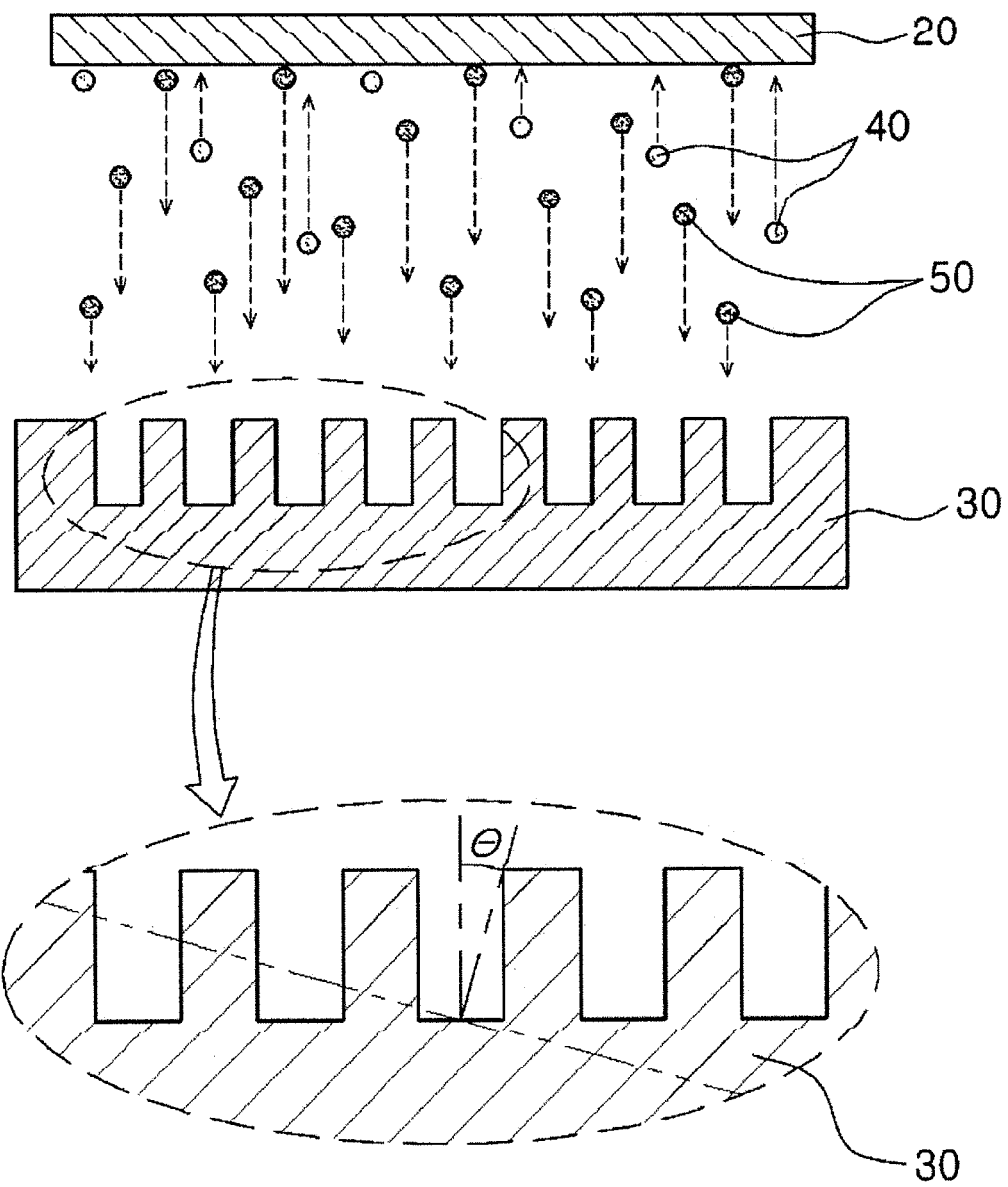
FIG. 2 schematically illustrates the deposition of a seed layer forming material onto a substrate from a target.

FIG. 2 schematically illustrates the deposition of the seed layer forming material onto the substrate from a target. As illustrated in FIG. 2, the seed layer forming material 50 bounced from the target 20 is deposited on the substrate 30 by means of an inert gas such as Ar 40. As such, the substrate 30 is preferably tilted such that the angle ($\theta$) is defined to 2.86° or less between the direction of deposition of the seed layer forming material 50 and the inner wall of the vias of the substrate 30, thus forming the seed layer. Meanwhile, the method of forming the seed layer according to the present invention may be implemented in such a manner that the seed layer is formed under the condition that the substrate is not tilted, namely, at an angle of 0°. However, in the case where the angle is 0° upon forming the seed layer (where the substrate is not tilted), the direction of deposition of the seed layer forming material becomes parallel to the inner wall of the vias, and thus the seed layer forming material may not be desirably deposited on the inner wall of the vias. In contrast, if the angle exceeds 2.86°, only a portion of the inner wall of the vias is coated, making it difficult to uniformly coat the inside of the vias, that is, the bottom and the inner wall of the vias.

Figure 3:
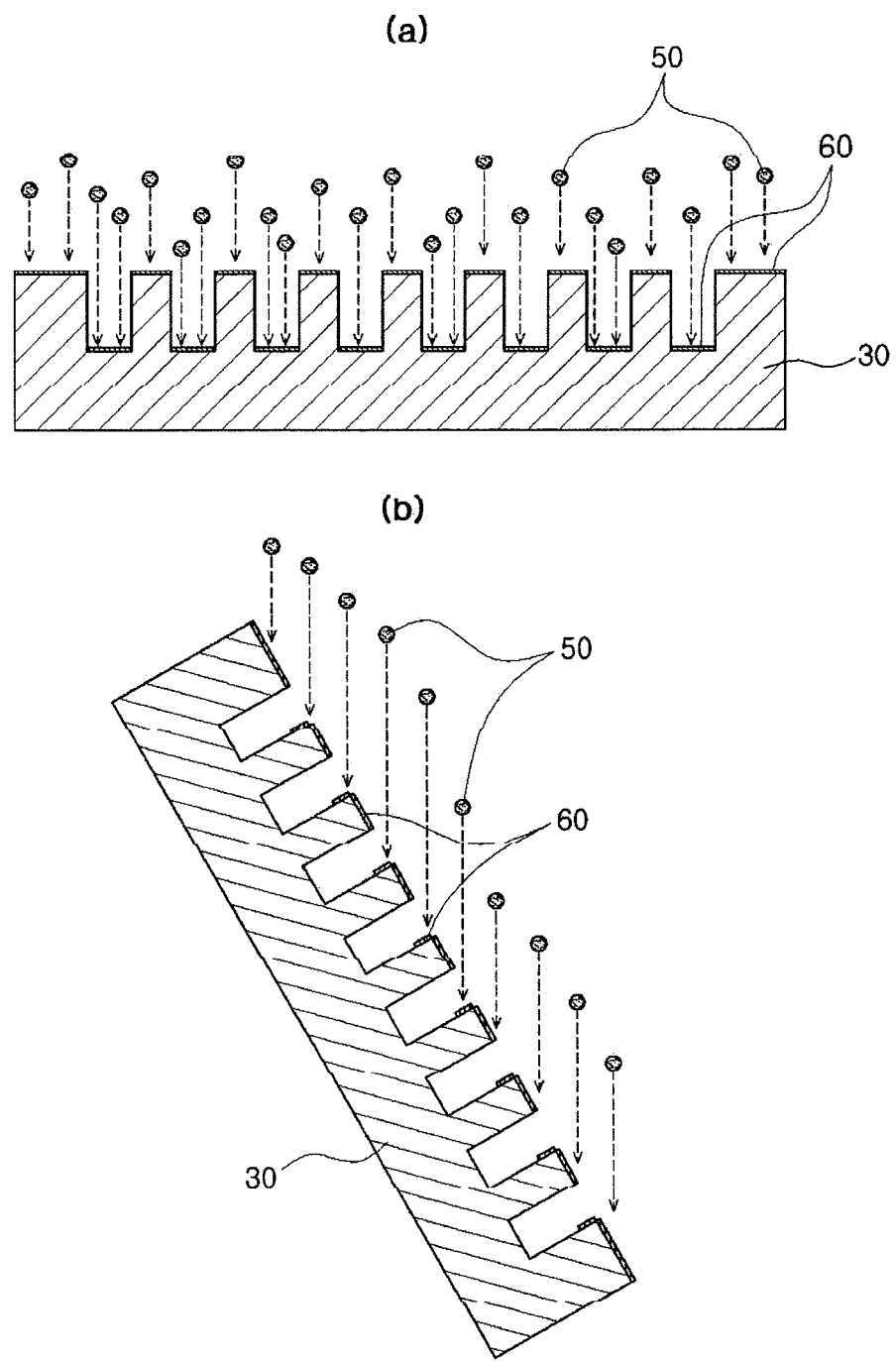
FIG. 3 schematically illustrates the formation of a seed layer inside the via depending on the angle of the substrate, showing (a) an angle of 0° between a direction of deposition of a seed layer forming material on a substrate and a direction of the inner wall of the vias of the substrate, and (b) an angle exceeding 2.86° therebetween.

For example, a phenomenon illustrated in FIG. 3 may take place. FIG. 3 schematically illustrates the formation of a seed layer inside the vias depending on the angle of the substrate, showing (a) an angle of 0° between the direction of deposition of the seed layer forming material on the substrate and the direction of the inner wall of the vias of the substrate, and (b) an angle exceeding 2.86° therebetween. As illustrated in FIG. 3(a), in the case where the angle is 0° between the direction of deposition of the seed layer forming material and the direction of the inner wall of the vias, deposition of the seed layer forming material may not occur on the inner wall of the vias. On the other hand, as illustrated in FIG. 3(b), in the case where such an angle exceeds 2.86°, deposition of the seed layer forming material takes place only on a portion of the inner wall of the vias, and the bottom and the remaining inner wall of the vias may not be deposited.

Hence, the angle between the direction of deposition of the seed layer forming material 50 on the substrate 30 and the substrate 30 should preferably satisfy the range of 2.86° or less. For uniform coating with the seed layer forming material, it is preferred that the tilting direction of the substrate be changed. Specifically, the substrate is preferably tilted front and back and left and right. As such, when the longitudinal direction of the substrate is set to left and right, the width direction of the substrate becomes front and back, or vice versa, which is also incorporated in the scope of the present invention. Meanwhile, so long as the substrate is tilted once in each of front, back, left, and right directions, the sequence of tilting the substrate is not particularly limited. If the substrate is tilted only left and right, the seed layer is deposited in a larger amount in the left and right direction of the vias compared to the front and back direction of the vias, thus reducing the area of via openings. Consequently, it is difficult to deposit the seed layer inside the vias, or Cu filling-plating is not efficiently carried out.

Figure 4:
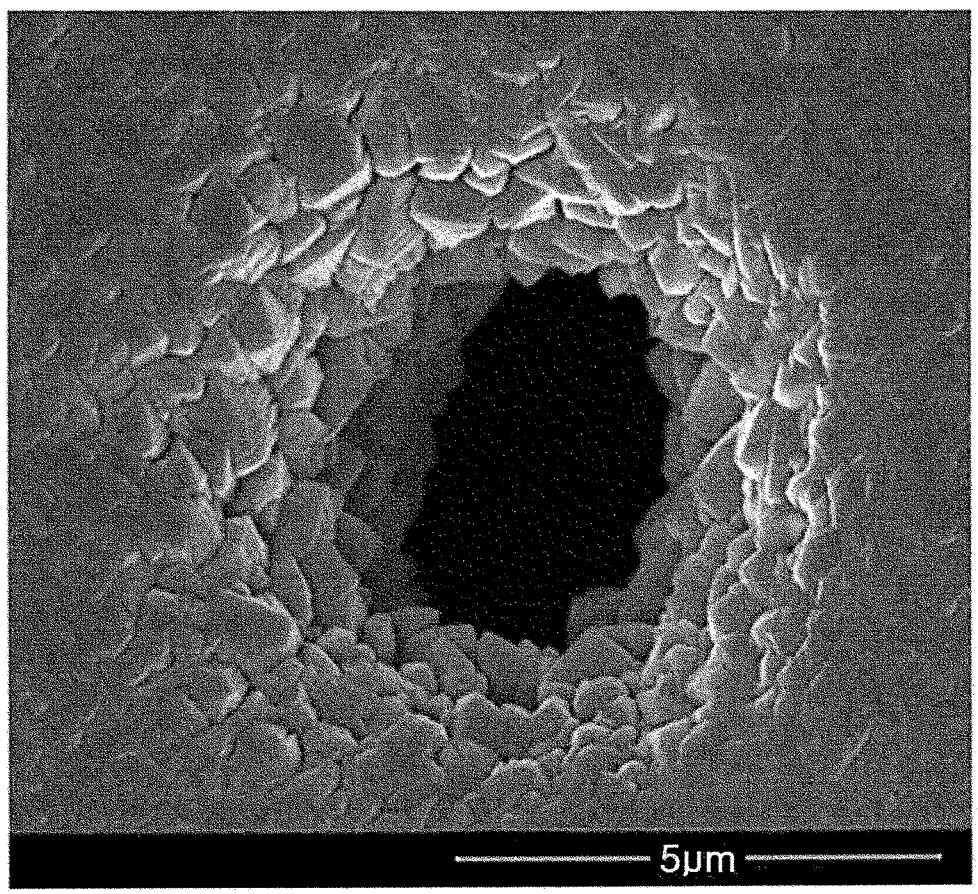
FIG. 4 illustrates the surface of a seed layer formed by tilting the substrate left and right.

FIG. 4 illustrates the image of the surface of the seed layer formed by tilting the substrate left and right. As illustrated in FIG. 4, when the substrate is tilted only left and right, the seed layer is deposited in a larger amount in the left and right direction of the via, and the area of the via opening may also be small. Hence, in the present invention, at least one of a tilting movement for tilting the substrate front and back and left and right and a turning movement of the substrate is performed so that the area of via openings is enlarged as much as possible, and simultaneously the seed layer may be formed to a uniform and sufficient thickness inside the vias. The turning movement of the substrate includes only rotation of the substrate, revolution of the substrate with rotation, and revolution of the substrate without rotation.

As such, a change in the tilting direction caused by at least one of the tilting movement and the turning movement of the substrate may be intermittent or continuous. The intermittent change means that the substrate is tilted in any one of front, back, left, and right directions and then the seed layer is formed for a predetermined period of time, after which the substrate is tilted in the other direction under the condition that the formation of the seed layer is stopped, followed by forming the seed layer for a predetermined period of time, all of which are repeated. The continuous change means that formation of the seed layer and a change in the tilting of the substrate are continuously performed.

Figure 5:
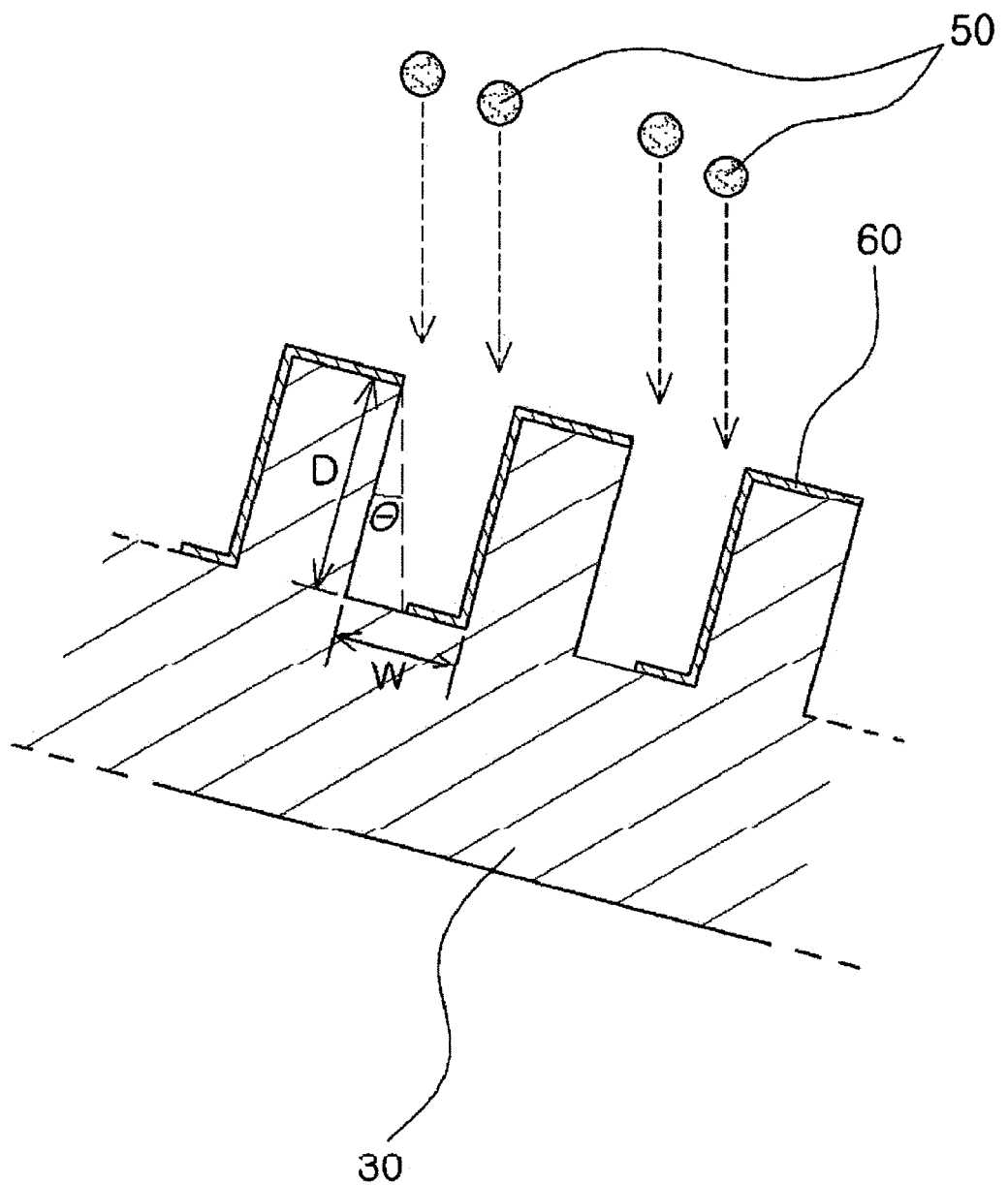
FIG. 5 schematically illustrates the calculation of the angle of a substrate depending on the aspect ratio of vias.

The angle range is determined depending on the ratio of average depth to average width (aspect ratio) as mentioned above, and the calculation method thereof is explained by FIG. 5. As illustrated in FIG. 5, ½ of the width of the via is preferably set as a base position so that the bottom and the inner wall of the vias are uniformly coated. Hence, Equation 1 as above may be constructed.

Specifically, when the average depth is 10 times the average width, for example, when the average depth (D) is 100 μm and the average width (W) is 10 μm, the maximum tilting angle of the substrate becomes 2.86°. Even when the substrate is tilted within the above angle range to form the seed layer, a preferable effect of depositing the seed layer may be obtained. However, when the deposition is performed at 2.86°, the inner wall of the vias is opened in the largest amount, and thus deposition of the seed layer is more preferably implemented. Briefly, when the aspect ratio is 10:1, the optimal tilting angle of the substrate is 2.86°. Moreover, the optimal angle depending on the aspect ratio of vias may be easily calculated through the above calculation method by those skilled in the art.

Upon forming the seed layer on high-aspect ratio vias as proposed by the present invention, when the seed layer is formed while the substrate is tilted front and back and left and right, the area of via openings may be ensured to be large, and the seed layer forming material may be uniformly deposited on the bottom and the inner wall of the vias. Thereby, filling-plating may be easily performed, and plating adhesion between the seed layer and the filling-plated metal may be simply and profitably enhanced. Furthermore, plating adhesion may be assured to be remarkably high, thus imparting high durability upon forming metal wiring for electronic components.

To more preferably form a seed layer, forming the seed layer may be implemented through a first step of controlling a pressure to 7~13 mtorr and a second step of controlling a pressure to 2.5~5 mtorr. When the seed layer is formed in the first step, high pressure is applied, and when the seed layer is formed in the second step, pressure lower than that in the first step is applied, thereby adjusting the grain width of the columnar structure of the microstructure, ultimately controlling changes in stress such as tensile stress or compressive stress of the seed layer, resulting in lowered stress. If the pressure is less than 7 mtorr in the first step for forming the seed layer, it is difficult to reduce the grain width of the columnar structure to the extent that stress may be lowered. In contrast, if the pressure exceeds 13 mtorr, resistivity may increase undesirably. Also, if the pressure is less than 2.5 mtorr in the second step for forming the seed layer, changes in the grain width of the columnar structure may drastically increase, making it difficult to control stress. In contrast, if the pressure exceeds 5 mtorr, the seed layer having high resistivity may be thickly formed.

When forming the seed layer is performed in only two steps, the resulting films may have different properties, thus decreasing adhesion between seed layers or increasing stress. Hence, a third step of controlling a pressure to 0.5~2 mtorr is preferably further carried out after the second step. Ultimately, adhesion between seed layers may be enhanced, and stress may be further decreased.

Also, forming the seed layer is preferably performed by applying a target power of 2~5 kW. When the target power is controlled in this way, the deposition rate and the stress may be easily regulated. If the target power is less than 2 kW, the processing time may be excessively lengthened. In contrast, if the target power exceeds 5 kW, the entrance of the vias may be closed, making it difficult to form a seed layer having a sufficient thickness.

Also, forming the seed layer is preferably performed by applying a bias to the substrate. When a bias is applied to the substrate in this way, metal ions are attracted to the substrate, thus increasing the density and adhesion of the seed layer, ultimately enhancing conductivity and adhesive force.

Meanwhile, the seed layer according to the present invention is preferably a Mo or Cu seed layer.

The Cu seed layer may exhibit an effect of enhancing adhesion to Cu that is subsequently filling-plated. The Mo seed layer manifests superior strength and plays a role in preventing deposited Cu from being diffused into the substrate. Furthermore, the Mo seed layer possesses superior adhesion to Cu. Hence, preferably useful for the seed layer is Mo.

Figure 6:
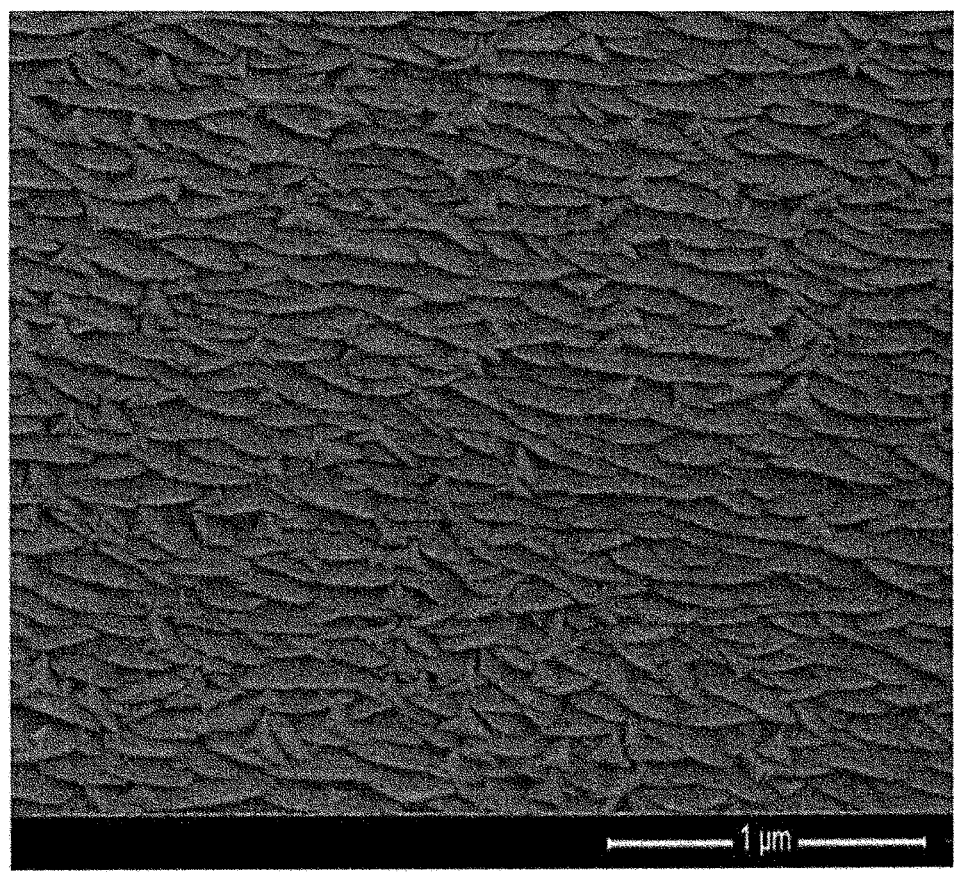
FIG. 6 illustrates a scanning electron microscope (SEM) image of the surface of Mo deposited on a Si substrate.

FIG. 6 illustrates an SEM image of the surface of Mo deposited on the Si substrate. As illustrated in FIG. 6, the surface of Mo has thorn-like protrusions to thus enlarge the contact area between Si and filling-plated Cu, resulting in enhanced adhesion.

Figure 7:
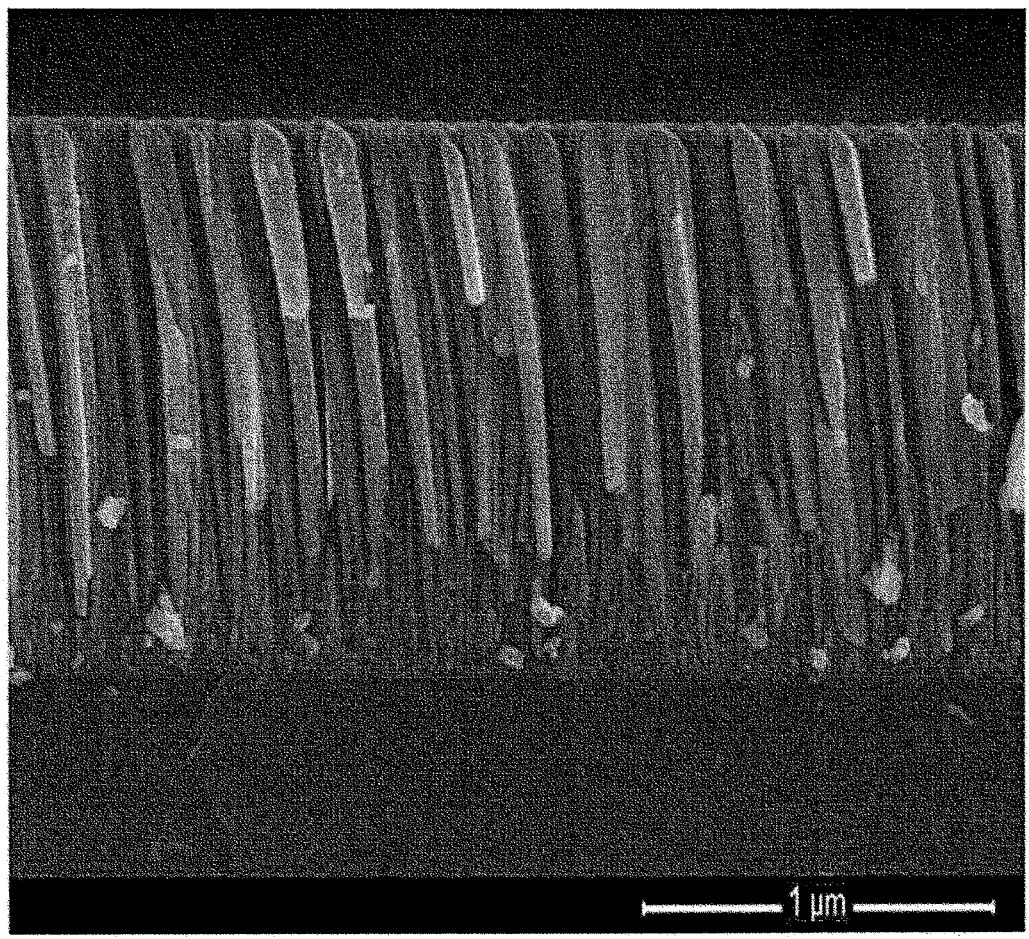
FIG. 7 illustrates an SEM image of the side of Mo deposited on a Si substrate.

FIG. 7 illustrates an SEM image of the side of Mo deposited on the Si substrate. As illustrated in FIG. 7, Mo has a columnar structure. The width of such a columnar structure may be adjusted by controlling processing conditions such as pressure or temperature upon sputtering for forming the seed layer. Since the electrical conductivity varies depending on the width of the columnar structure, desired electrical conductivity properties may be ensured by controlling the width of the columnar structure. Also, adhesion varies depending on the width of the columnar structure. Specifically, processing conditions are controlled upon sputtering Mo to thus control the width of the columnar structure, whereby a substrate having superior adhesion and high electrical conductivity may be manufactured. For example, in the initial sputtering, the width of the columnar structure is thinned to enhance adhesion, after which the width of the columnar structure is thickened, thus increasing electrical conductivity, so that both of two properties may be improved to the desired level.

When the Mo or Cu seed layer is used as mentioned above, adhesion thereof to filling-plated Cu may be further enhanced. In order to impart higher adhesion, a Cu seed layer may be additionally formed on the Mo seed layer, or a Mo seed layer may be additionally formed on the Cu seed layer. Specifically, when the seed layer in a double layered structure comprising a Mo seed layer and a Cu seed layer is formed on the substrate, adhesion thereof to filling-plated Cu may be remarkably enhanced. Moreover, the additionally formed Mo or Cu seed layer may be deposited by tilting the substrate as mentioned above.

Figure 8:
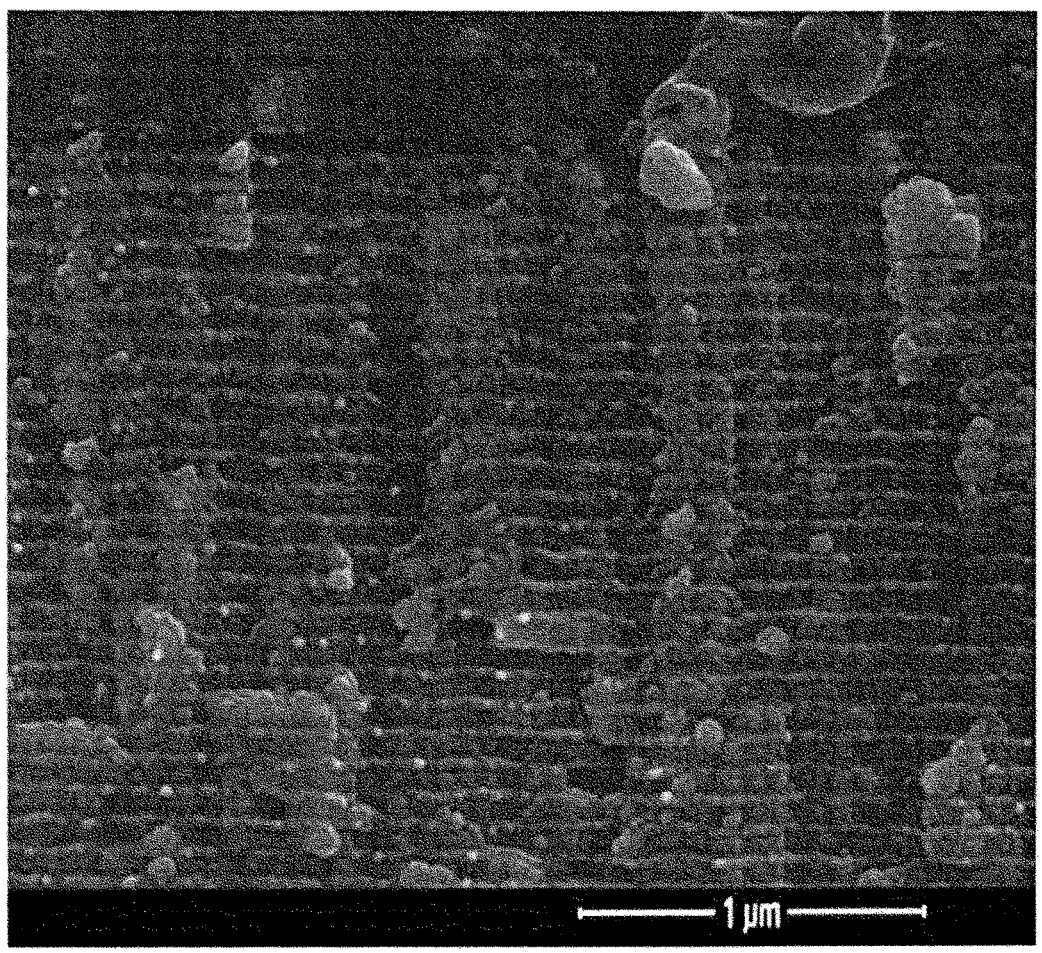
FIG. 8 illustrates an SEM image of a seed layer in a multilayered structure comprising Mo and Cu seed layers, which are alternately stacked.
Figure 9A:
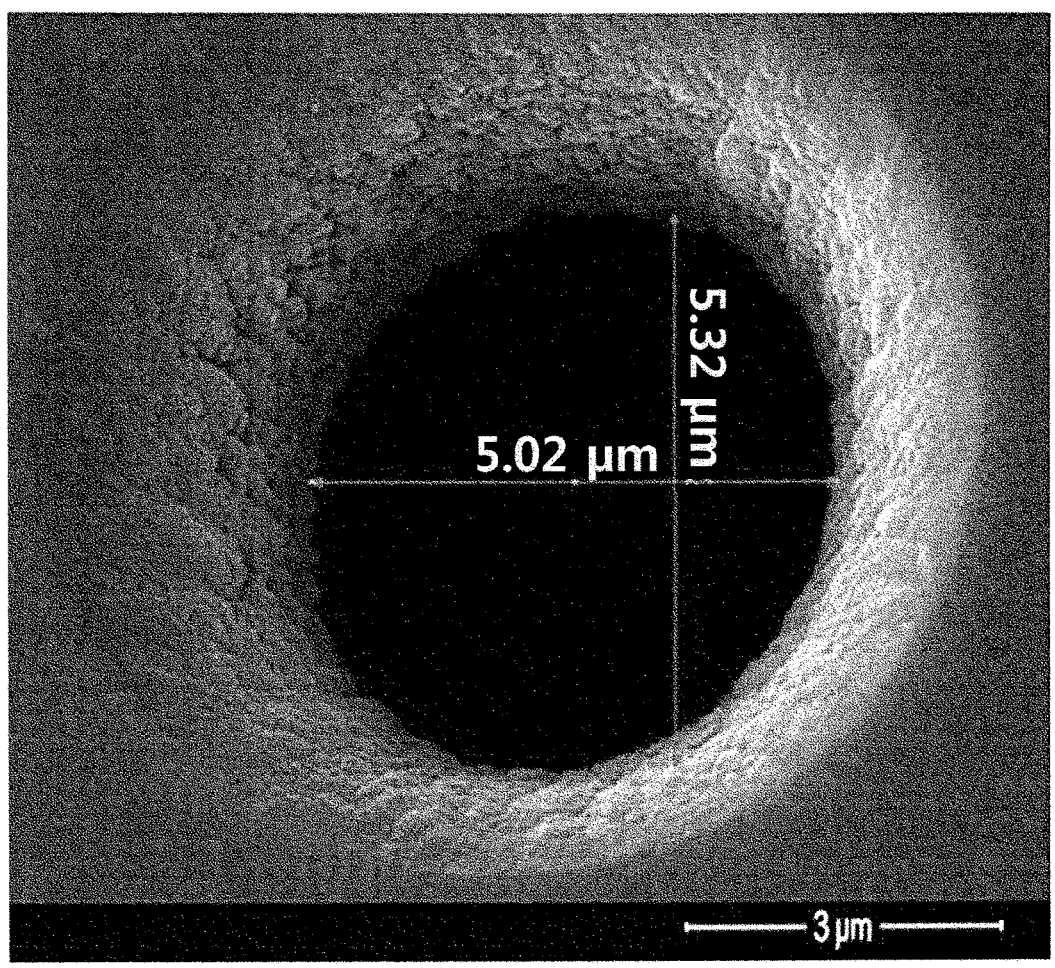
FIG. 9 illustrates SEM images of vias in inventive examples according to an embodiment of the present invention, showing (a) Inventive Example 1, (b) Inventive Example 2, (c) Inventive Example 3, and (d) Inventive Example 4.
Figure 9B:
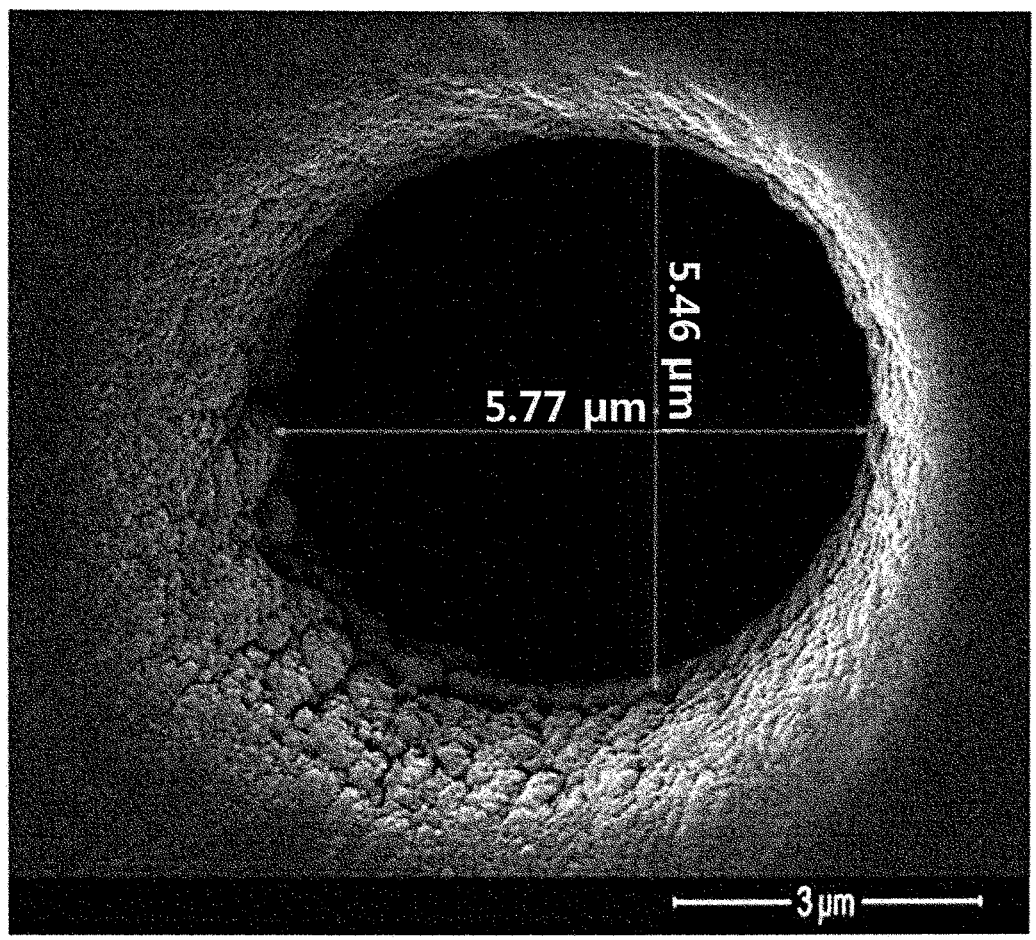
Figure 9C:
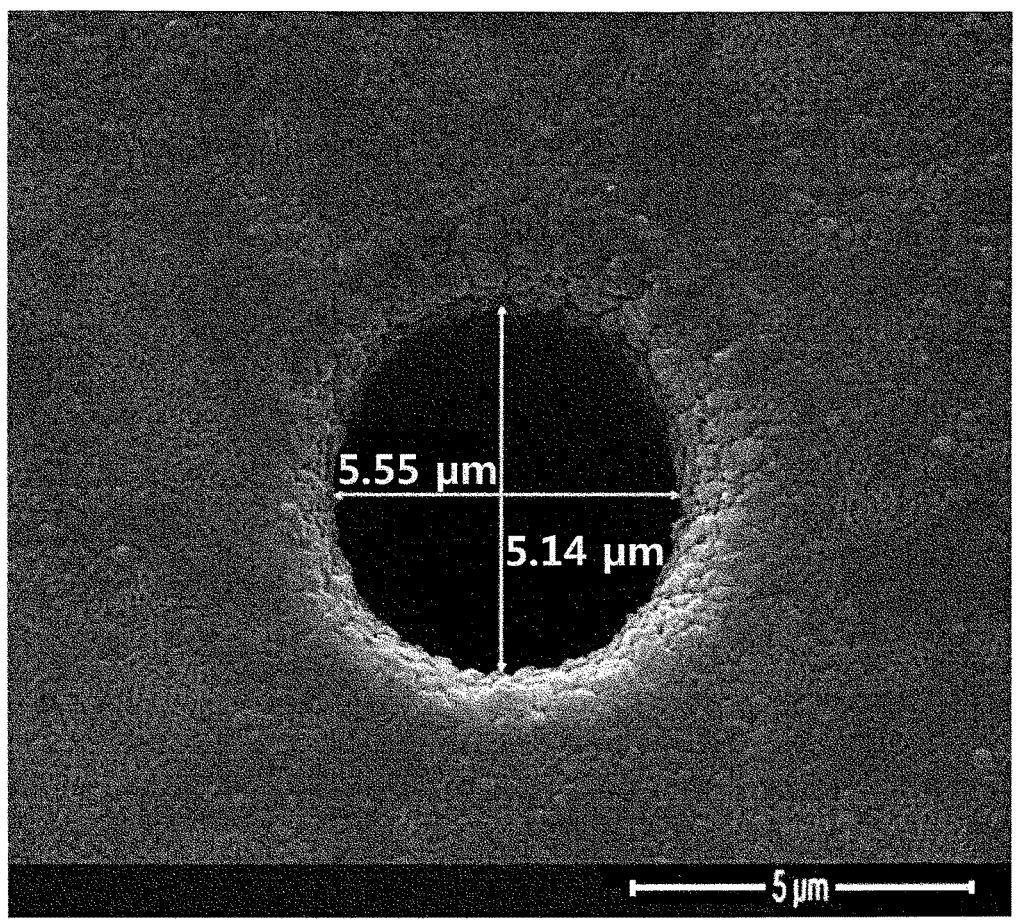
Figure 9D:
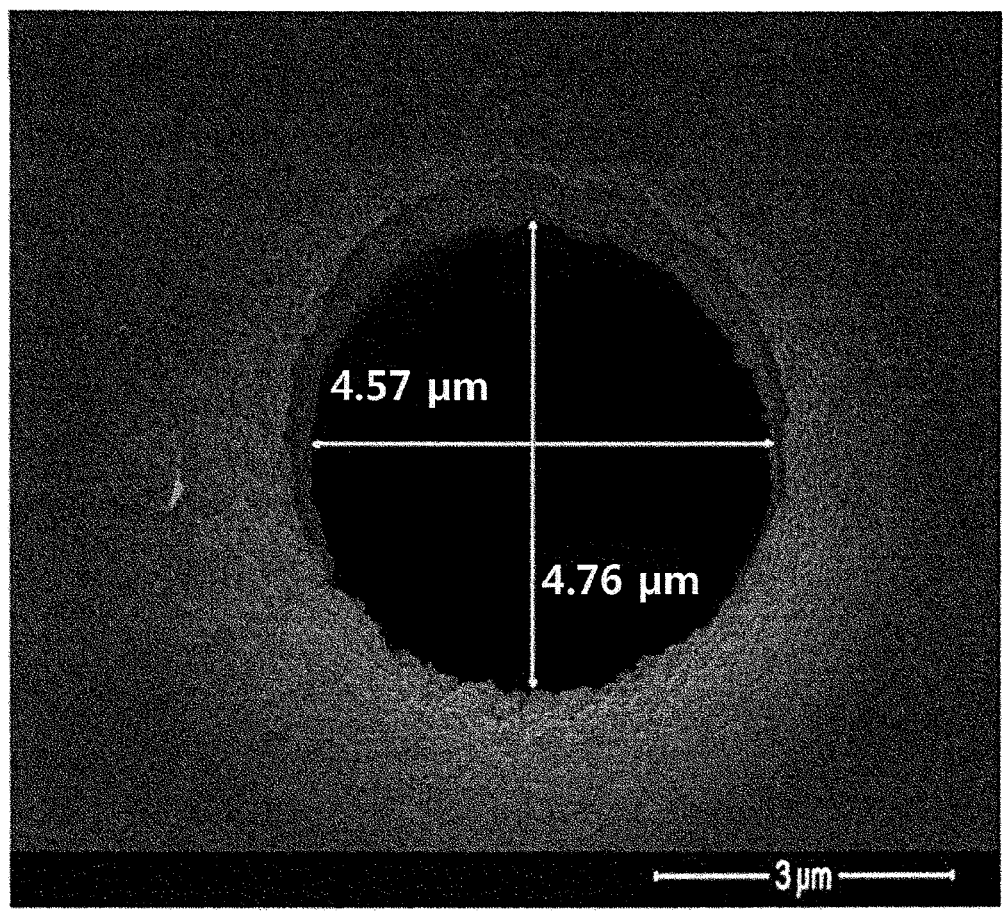

Also, in the present invention, after additionally forming the seed layer, forming an additional seed layer may be further implemented so that a Mo seed layer and a Cu seed layer are alternately stacked. FIG. 8 illustrates an SEM image of the seed layer in a multilayered structure comprising Mo and Cu seed layers, which are alternately stacked. As illustrated in FIG. 8, as layers having a thickness ranging from ones to tens of nm are alternately stacked, the surface morphology of the microstructure may be controlled, and stress of the seed layer may be decreased, with an enhancement in the adhesion. More specifically, effects of the crystal directionality and grain morphology of a single kind of seed layer may be decreased, making it possible to form a seed layer close to equiangular coating.

In particular, defects due to shadow effects may be mitigated inside the vias that are difficult to deposit. The seed layer may be provided in a structure comprising ones of layers to tens or hundreds of layers.

When the seed layer is formed on the substrate in this way, the seed layer is formed not only inside the vias but also on the substrate. Thus, there is a need to remove the seed layer from the surface of the substrate, except for the inside of the vias, depending on the type of applicable component. To this end, the surface of the substrate except for the vias is covered with a deposition barrier film, after which the seed layer may be formed. Alternatively, the seed layer is formed and then the portion of the seed layer, except for the seed layer formed on the holes or grooves of the substrate, may be removed using etching or mechanical processing.

The thickness of the seed layer formed by the method according to the present invention as above preferably falls in the range of 20 nm to 1 µm. If the thickness of the seed layer is less than 20 nm, sufficient electrical conductivity is not ensured, and current density cannot be sufficiently obtained upon Cu filling-plating, making it difficult to efficiently perform filling-plating. Furthermore, diffusion cannot be effectively prevented. In contrast, if the thickness thereof exceeds 1 µm, the entrance of the vias may be closed due to excessive thickness, making it difficult to perform Cu filling-plating. Hence, the thickness of the seed layer is preferably set to the range of 20 nm to 1 µm, and more preferably the range of 40 nm to 1 µm.

Also, the vias are preferably configured such that the cross-sectional area of the via openings after formation of the seed layer is 50% or more compared to before formation of the seed layer, when viewed from above. When such a high cross-sectional area of the via openings is ensured, the seed layer forming material may easily penetrate into the vias upon forming the seed layer, so that it is deposited on both the bottom and the inner wall of the vias, thereby enabling the formation of the seed layer having a uniform thickness. Also, filling-plated Cu may easily penetrate into the vias, thereby forming metal wiring having superior properties.

After formation of the seed layer on the substrate, filling-plating the seed layer with Cu may be additionally performed, thereby manufacturing a substrate having metal wiring adapted for semiconductor devices. Any Cu filling-plating process may be applied so long as it is typically useful in the art, and the type thereof is not particularly limited.

As the seed layer is formed on the substrate having high-aspect ratio vias in this way, a semiconductor device having high-aspect ratio vias according to the present invention is configured such that the vias of the substrate have an aspect ratio ranging from 1:10 to 1:60. Also, even when the seed layer is formed on the substrate, the cross-sectional area of the via openings after formation of the seed layer is 50% or more compared to before formation of the seed layer, when viewed from above. Hence, the semiconductor device having the high-aspect ratio vias according to the present invention possesses the seed layer having a sufficient thickness for filling-plating, namely, a thickness of 20 nm~1 µm, and also, the area of the via openings after formation of the seed layer may be sufficiently ensured.

Example 1

A Si substrate having vias with an average depth of 100 µm and an average width of 10 µm, and 450 mm×120 mm×6.35 mm sized Cu and Mo targets were prepared, after which sputtering was performed while the substrate was tilted under the conditions of Table 1 below, thus forming a seed layer. As such, the tilting angle of the substrate was 2.86°, and the seed layer was formed by sputtering Cu, or by sputtering Mo and then Cu.

The seed layer thus formed was measured for thickness and resistivity and the cross-sectional area of via openings was measured. The results are shown in Table 2 below. The cross-sectional area of the via openings was represented by PVO (Percent of Via Open), indicative of the ratio of the cross-sectional area of the via opening after formation of the seed layer relative to the cross-sectional area of the via opening before formation of the seed layer. Since it is difficult to directly measure resistivity of the seed layer formed inside the vias, resistance of the seed layer was determined by measuring resistivity of the seed layer formed on the surface of the substrate. However, in Comparative Example 2, the seed layer was stripped from the surface of the substrate, and thus resistance thereof could not be measured.

PVO (%)=cross-sectional area of via opening after formation of seed layer/cross-sectional area of via opening before formation of seed layer×100

On the other hand, in Comparative Examples 1 and 2 for forming the seed layer by tilting the substrate left and right without satisfying the requirements proposed by the present invention, the sufficient opening area was not assured. Particularly in Comparative Example 2, the seed layer had a low thickness.

Figure 10A:
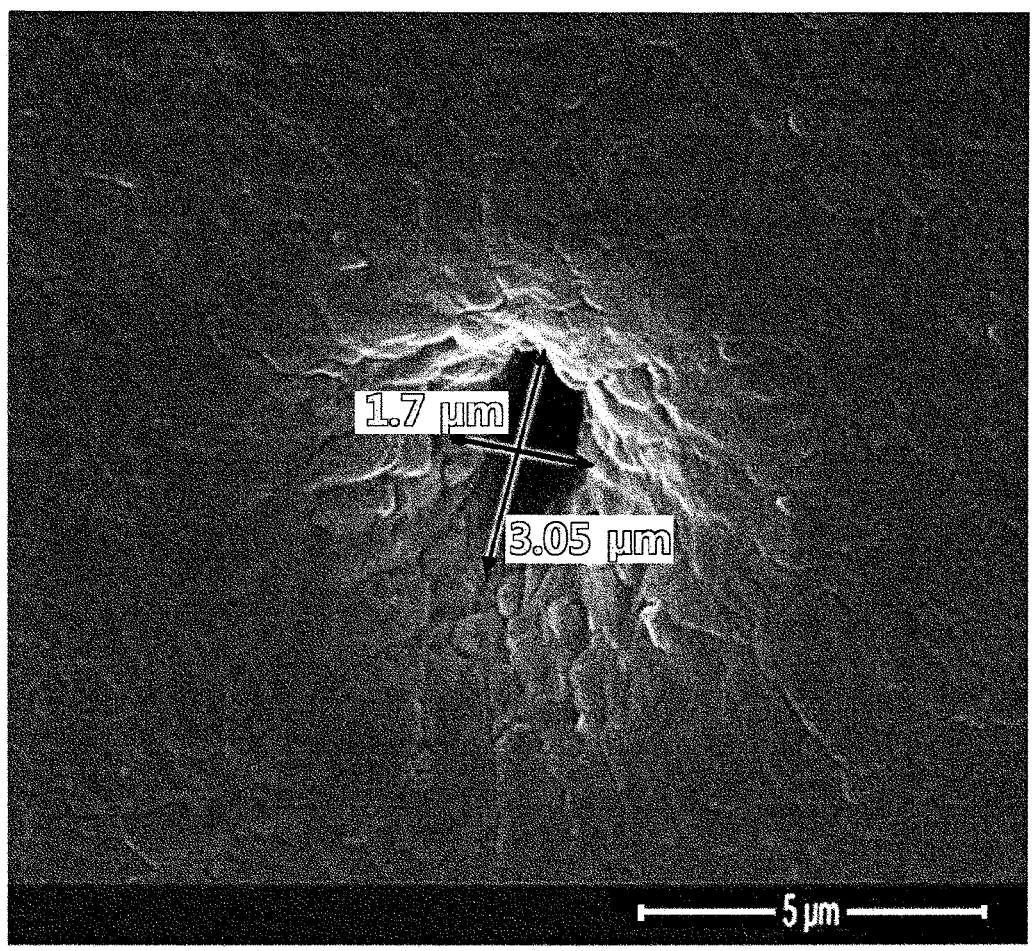
FIG. 10 illustrates SEM images of vias in comparative examples according to an embodiment of the present invention, showing (a) Comparative Example 1, and (b) Comparative Example 2.
Figure 10B:
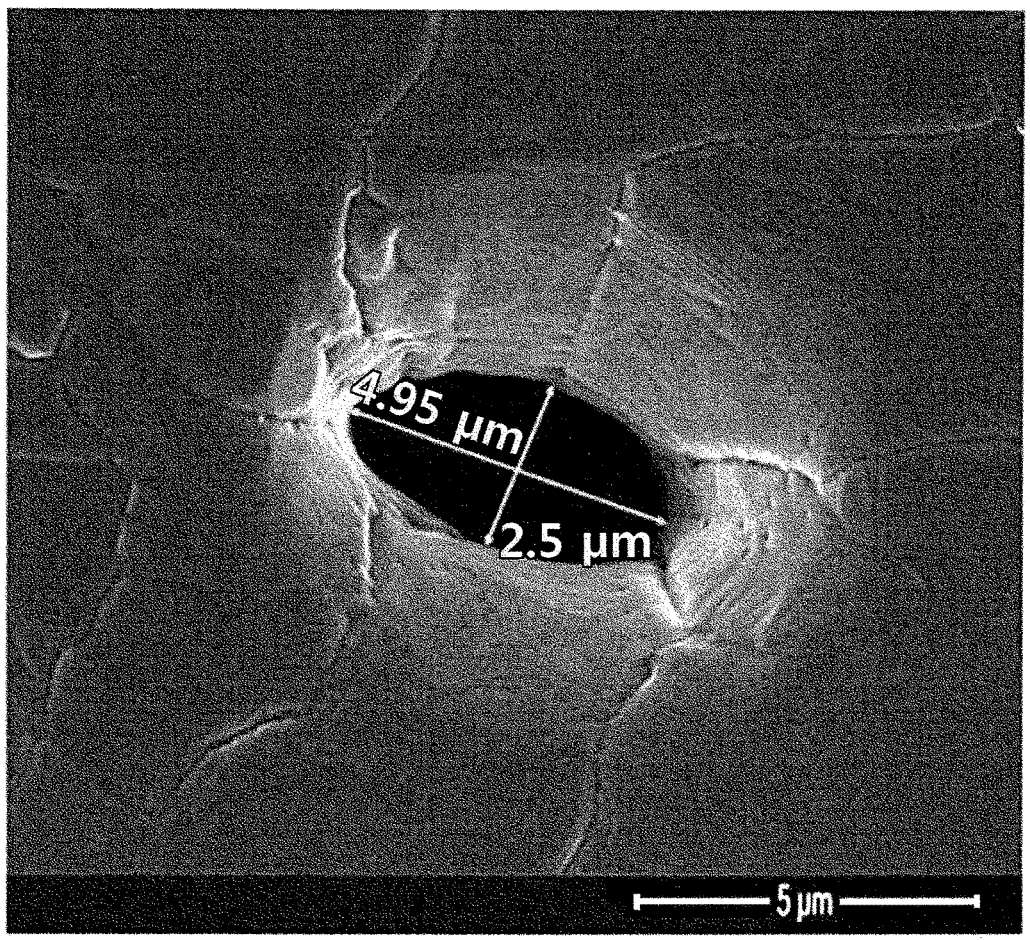

FIGS. 9a to 9d illustrate SEM images of the vias in inventive examples according to an embodiment of the present invention, showing (a) Inventive Example 1, (b) Inventive Example 2, (c) Inventive Example 3, and (d) Inventive Example 4. FIGS. 10a and 10b illustrate SEM images of the vias in comparative examples according to an embodiment of the present invention, showing (a) Comparative Example 1, and (b) Comparative Example 2.

As illustrated in 9a to 9d, in Inventive Examples 1 to 4, the seed layer was formed so that the via opening was almost circular in shape, and the opening was also sufficiently opened. However, as illustrated in FIGS. 10a and 10b, in Comparative Examples 1 and 2, the via opening was oval in shape and was considerably closed.

Based on such testing results, even when sputtering is performed for a relatively long period of time at a maximum DC power of 5 KW as in Comparative Examples 1 and 2, the thickness of the bottom seed layer is decreased under the condition that the entrance of the via is closed. Therefore, when the opening is formed to have an almost circular shape as in the present invention, the bottom seed layer may be thickly formed. Hence, in order to ensure the circular shape and the relatively large cross-sectional area of via openings, pressure and power have to be controlled, as well as the orbital movement and tilting of the substrate.

TABLE 1

| | Mo Sputtering Conditions | | | | Cu Sputtering Conditions | | | | |
|---|---|---|---|---|---|---|---|---|---|
| | DC power (kW) | Pressure (mtorr) | RF bias (kW) | Time (min) | DC power (kW) | Pressure (mtorr) | RF bias (kW) | Time (min) | Tiling direction of substrate |
| Inv. Ex. 1 | — | — | — | — | 5 | 1 | 1 | 20 | Front/back Left/right |
| Inv. Ex. 2 | — | — | — | — | 5 | 1 | — | 20 | Front/back Left/right Rotation |
| Inv. Ex. 3 | 2 | 1.2 | — | 16 | 2 | 3 | — | 10 | Front/back Left/right Rotation |
| Inv. Ex. 4 | 2 | 1.2 | — | 16 | 2 | 1 | — | 20 | Front/back Left/right |
| C. Ex. 1 | 4.8 | 1 | 1 | 20 | 5 | 1 | 1 | 20 | Left/right |
| C. Ex. 2 | 4.8 | 1 | 1 | 10 | 5 | 1 | 1 | 20 | Left/right |

TABLE 2

| | Thickness (nm) | Resistivity (μΩ · cm) | PVO (%) |
|---|---|---|---|
| Inv. Ex. 1 | 48.4 | 1.895 | 57.83 |
| Inv. Ex. 2 | 87.2 | 1.994 | 62.38 |
| Inv. Ex. 3 | 46.7 | 2.61 | 64.4 |
| Inv. Ex. 4 | 69.2 | 2.29 | 51.8 |
| C. Ex. 1 | 37.9 | — | 26.38 |
| C. Ex. 2 | 17.5 | 2.01 | 41.38 |

As is apparent from Tables 1 and 2, in Inventive Examples 1 to 4 for forming the seed layer by tilting the substrate front and back and left and right so as to satisfy the requirements proposed by the present invention, the seed layer was formed to a sufficient thickness and a sufficient opening area of 50% or more was ensured, thereby facilitating Cu filling-plating. Furthermore, low resistivity was attained, resulting in high electrical conductivity.

Example 2

A Si substrate having vias with an average depth of 100 μm and an average width of 10 and a 450 mm×120 mm×6.35 mm sized Mo target were prepared. The substrate was subjected to revolution while tilting the substrate front and back and left and right at an angle of 2.86°, and two-step sputtering was carried out under pressure conditions as shown in Table 3 below, thus forming a seed layer. The seed layer thus formed was measured for surface resistance and stress. The results are given in Table 3 below.

TABLE 3

| | Mo Sputtering Conditions | | | Cu Sputtering Conditions | | | Surface resistance (μΩ/□) | Stress (Gpa) |
|---|---|---|---|---|---|---|---|---|
| | DC power (kW) | Pressure (mtorr) | Time (min) | DC power (kW) | Pressure (mtorr) | Time (min) | | |
| Inv. Ex. 5 | 2 | 10 | 20 | 2 | 2.5 | 20 | 43.645 | −0.1779 |
| Inv. Ex. 6 | 2 | 10 | 40 | — | — | — | 37.74 | 1.2093 |

Both Inventive Examples 5 and 6 sputtered so as to satisfy the requirements proposed by the present invention exhibited low surface resistance. In particular, in Inventive Example 5 for forming the seed layer through two steps under high pressure and low pressure, stress was decreased about 6.8 times compared to Inventive Example 6. Briefly, formation of the seed layer through at least two steps under high pressure and low pressure is very effective at reducing stress.

The stress is regarded as low when being close to 0, and '−' indicates tensile stress and '+' indicates compressive stress.

Example 3

A Si substrate having vias with an average depth of 100 μm and an average width of 10 μm, and 450 mm×120 mm×6.35 mm sized Mo and Cu targets were prepared, and a seed layer was formed so that Mo and Cu were alternately stacked under the conditions of Table 4 below. As such, the substrate was simultaneously subjected to rotation and revolution while being tilted front and back and left and right, and the tilting angle of the substrate was 2.86°. In Inventive Example 8, additionally formed on the seed layer having alternately stacked Mo and Cu was Cu under conditions of a DC power of 5 kW and a pressure of 1 mtorr for 10 min. The resulting seed layer was measured for thickness and resistivity, and cross-sectional area of via openings and stress were measured. The results are shown in Table 4 below.

TABLE 4

| | Mo Sputtering Conditions | | Cu Sputtering Conditions | | Total time (min) | Thick. (nm) | Resistivity (μΩ·cm) | PVO (%) | Stress (GPa) |
|---|---|---|---|---|---|---|---|---|---|
| | DC power (kw) | Pressure (mtorr) | DC power (kW) | Pressure (mtorr) | | | | | |
| Inv. Ex. 7 | 2 | 2.5 | 2 | 2.5 | 60 | 37.9 | 11.25 | 64.3 | −0.6362 |
| Inv. Ex. 8 | 4 | 2.5 | 3 | 2.5 | 30 | 42.3 | 2.99 | 53.6 | −0.2936 |

In Inventive Examples 7 and 8 having alternately stacked Mo and Cu so as to satisfy the requirements of the present invention, the seed layer was formed to a sufficient thickness, and the sufficient opening area was attained. Also, both resistivity and stress were low.

Figure 11:
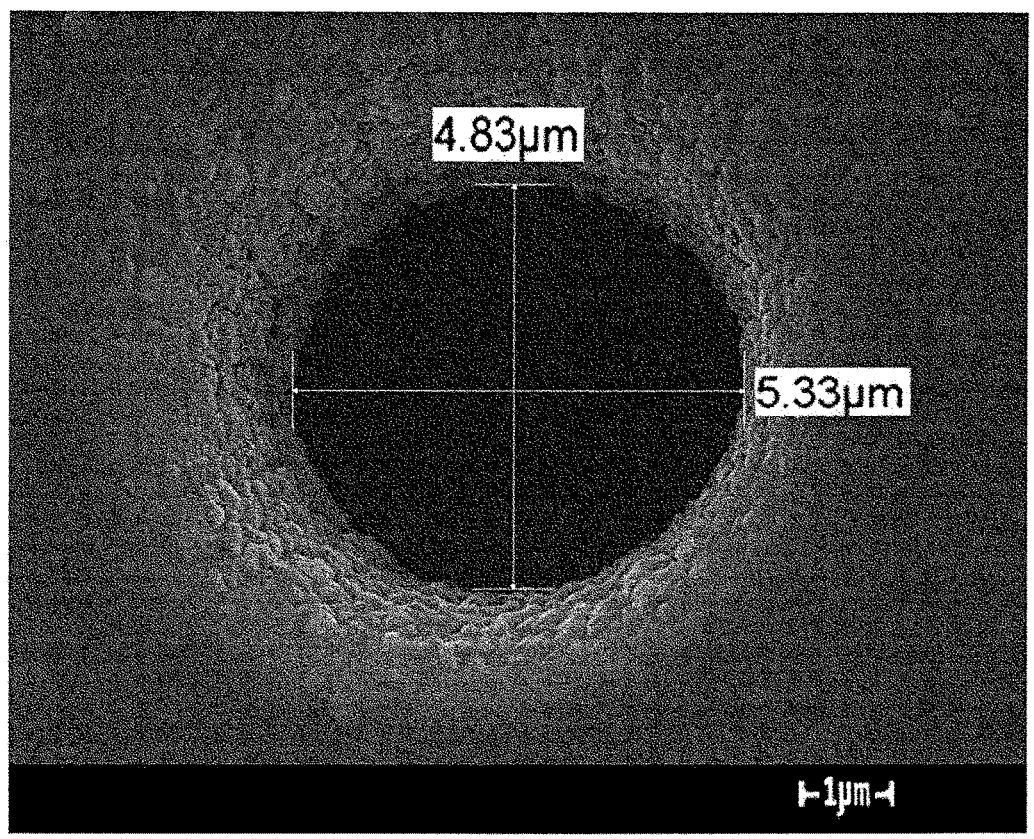
FIG. 11 illustrates an SEM image of the via of Inventive Example 8 according to an embodiment of the present invention.

FIG. 11 illustrates an SEM image of the via of Inventive Example 8 according to an embodiment of the present invention.

As illustrated in FIG. 11, the seed layer of Inventive Example 8 was formed so that the via opening was almost circular in shape, and the cross-sectional area of the via opening was large.

Although the preferred embodiments of the present invention have been disclosed for illustrative purposes, those skilled in the art will appreciate that various modifications and substitutions are possible, without departing from the scope and spirit of the invention as disclosed in the accompanying claims.

The invention claimed is:

1. A method of forming a seed layer on a high-aspect ratio via, comprising:
preparing a substrate having a via; and
forming a seed layer on the substrate,
wherein the via is configured such that an average depth is at least 10 times an average width based on a cross-section thereof, and
forming the seed layer is performed by a continuous tilting movement for tilting the substrate front, back, left and right so that a seed layer forming material is deposited at a predetermined angle,
wherein the predetermined angle is 2.86° or less as an angle (θ) represented by Equation 1 below:

$$\theta = \arccos\left[D/((D^2+(\tfrac{1}{2}W)^2)^{1/2})\right] \quad \text{Equation 1}$$

wherein D is a depth of the via, and W is a width of the via.

2. The method of claim 1, wherein forming the seed layer is performed by applying, a target power of 2 to 5 kW.

3. The method of claim 1, wherein forming the seed layer is performed by applying a bias to the substrate.

4. The method of claim 1, wherein the seed layer is a Mo or Cu seed layer.

5. The method of claim 1, wherein the seed layer has a thickness of 20 nm to 1 μm.

6. The method of claim 1, wherein the via is configured such that a cross-sectional area of a via opening after forming the seed layer is 50% or more compared to before forming the seed layer, when viewed from above.

7. The method of claim 1, wherein when the seed layer is a Mo or Cu seed layer, filling-plating the substrate with Cu is further performed after depositing the seed layer.

8. The method of claim 1, wherein while the continuous tilting movement for tilting the substrate front, back, left and right, the substrate is subjected to at least one of rotation and revolution.

9. A method of forming a seed layer on a high-aspect ratio via, comprising:

preparing a substrate having a via, wherein the via is configured such that an average depth is at least 10 times an average width based on a cross-section thereof; and forming a seed layer on the substrate, wherein forming the seed layer is performed by at least one of a tilting movement for tilting the substrate front, back, left and right, and a turning movement of the substrate so that a seed layer forming material is deposited at a predetermined angle, and a change in a direction of the substrate is intermittent or continuous, wherein forming the seed layer comprises a first step of controlling a pressure to 7 to 13 mtorr and a second step of controlling a pressure to 2.5 to 5 mtorr.

10. The method of claim 9, wherein forming the seed layer further comprises a third step of controlling a pressure to 0.5 to 2 mtorr, after the second step.

11. The method of claim 9, wherein the seed layer has a thickness of 20 nm to 1 μm.

12. The method of claim 9, wherein the via is configured such that a cross-sectional area of a via opening after forming the seed layer is 50% or more compared to before forming the seed layer, when viewed from above.

13. The method of claim 9, wherein when the seed layer is a Mo or Cu seed layer, filling-plating the substrate with Cu is further performed after depositing the seed layer.

\* \* \* \* \*